(12) United States Patent
Takahashi

(10) Patent No.: US 11,502,246 B2
(45) Date of Patent: Nov. 15, 2022

(54) MAGNETORESISTIVE DEVICE, MAGNETIC MEMORY, AND METHOD OF FABRICATING A MAGNETORESISTIVE DEVICE

(71) Applicant: SAMSUNG ELECTRONICS CO., LTD., Suwon-si (KR)

(72) Inventor: Shigeki Takahashi, Kanagawa (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 45 days.

(21) Appl. No.: 17/327,726

(22) Filed: May 23, 2021

(65) Prior Publication Data
US 2021/0384417 A1 Dec. 9, 2021

(30) Foreign Application Priority Data

Jun. 4, 2020 (JP) .............................. JP2020-097602
Mar. 12, 2021 (KR) ......................... 10-2021-0032927

(51) Int. Cl.
| | | |
|---|---|---|
| *G11C 16/04* | (2006.01) | |
| *H01L 43/12* | (2006.01) | |
| *H01L 43/02* | (2006.01) | |
| *G11C 11/16* | (2006.01) | |
| *H01L 43/10* | (2006.01) | |

(Continued)

(52) U.S. Cl.
CPC ............ *H01L 43/12* (2013.01); *G11C 11/161* (2013.01); *H01L 27/222* (2013.01); *H01L 43/02* (2013.01); *H01L 43/08* (2013.01); *H01L 43/10* (2013.01)

(58) Field of Classification Search
CPC ................................................... G11C 11/161
See application file for complete search history.

(56) References Cited

U.S. PATENT DOCUMENTS

| | | | |
|---|---|---|---|
| 9,257,638 B2 | 2/2016 | Tan et al. | |
| 9,601,688 B2 | 3/2017 | Ikeda | |
| 11,088,318 B2 * | 8/2021 | Sun | ......................... H01L 43/12 |

(Continued)

FOREIGN PATENT DOCUMENTS

| | | |
|---|---|---|
| JP | 2015192150 A | 11/2015 |
| JP | 201822796 A | 2/2018 |

(Continued)

OTHER PUBLICATIONS

S. Z. Rahaman et al., Pulse-Width and Temperature Effect on the Switching Behavior of an Etch-Stopon-MgO-Barrier Spin-Orbit Torque MRAM Cell IEEE Electron Devices Lett. 39 (2018) 1306.

(Continued)

*Primary Examiner* — Pho M Luu
(74) *Attorney, Agent, or Firm* — Volentine, Whitt & Francos, PLLC

(57) ABSTRACT

A magnetoresistive device includes a spin-orbit-torque (SOT) electrode layer, and a first magnetic layer, a first non-magnetic layer, and a second magnetic layer sequentially stacked over the SOT electrode layer. An interface layer is located between the SOT electrode layer and the first magnetic layer, and an etch stop layer covers a surface portion of the SOT electrode layer and is located adjacent the interface layer. The interface layer includes a metal having a spin diffusion length that is greater than a thickness of the interface layer, and the etch stop layer includes an oxide or nitride material of the metal.

20 Claims, 4 Drawing Sheets

(51) Int. Cl.
    *H01L 27/22*     (2006.01)
    *H01L 43/08*     (2006.01)

(56) References Cited

U.S. PATENT DOCUMENTS

| 11,107,975 B2 * | 8/2021 | Lin ........................ H01F 41/307 |
| 11,127,896 B2 * | 9/2021 | Alam ........................ H01L 43/02 |
| 2018/0145247 A1 | 5/2018 | Saito et al. |

FOREIGN PATENT DOCUMENTS

| WO | 2011071028 A1 | 6/2011 |
| WO | 201327406 A1 | 2/2013 |

OTHER PUBLICATIONS

Y. Ohsawa et al., Ultra-High-Efficiency Writing in Voltage-Control Spintronics Memory (VoCSM): The Most Promising Embedded Memory for Deep Learning, IEEE J. Electron Devices Soc. 6 (2018) 1233.

* cited by examiner

MAGNETORESISTIVE DEVICE, MAGNETIC MEMORY, AND METHOD OF FABRICATING A MAGNETORESISTIVE DEVICE

CROSS-REFERENCE TO RELATED APPLICATIONS

A claim of priority under 35 U.S.C. § 119 is made to Japanese Patent Application No. 2020-097602, filed on Jun. 4, 2020, in the Japan Patent Office, the entire disclosure of which is incorporated herein by reference.

BACKGROUND

The present disclosure relates to a magnetoresistive device, a magnetic memory, and a method of fabricating a magnetoresistive device.

Magnetic tunnel junctions (MTJs) are used to store data in a spin-transfer-torque is magnetoresistive (or magnetic) random access memory (STT-MRAM) device. MTJs are two-terminal structures which inherently suffer from narrow read margins and poor write characteristics, particularly when implemented in highly-integrated STT-MRAM devices. As a result, there has been increasing interest in a spin-orbit-torque (SOT) magnetoresistive (or magnetic) random access memory (SOT-MRAM) device having a three terminal structure. The SOT-MRAM device is characterized in part by writing operations being performed as the result of a spin current generated from a current based on a spin hole effect (SHE).

Ohsawa et al. discloses techniques which result in an etch damage issue on a SOT electrode layer, which may arise when an MTJ etching process is performed to fabricate a SOT-MRAM device, and techniques intended to solve this issue. See Y. Ohsawa et al., Ultra-High-Efficiency Writing in Voltage-Control Spintronics Memory (VoCSM): The Most Promising Embedded Memory for Deep Learning, IEEE J. Electron Devices Soc. 6 (2018) 1233.

Ohsawa et al. discloses a method of etching an MTJ structure, which includes a thin SOT electrode layer, using a highly selective etching (HSE) process to reduce an etch damage on the thin SOT electrode layer. If a conventional etching process is used, a thickness of the SOT electrode layer is reduced from 10 nm to 6.8 nm, due to an etch damage. By contrast, if the HSE process is used, the etch damage is reduced by about 1 nm, and thus, the initial thickness (i.e., 10 nm) of the SOT electrode layer is reduced to 8.9 nm when the etching process is finished.

In a practical device, a thickness of a SOT electrode layer is about 5 nm, and in this case, the SOT electrode layer suffers the disadvantage of being strongly affected by an etch damage.

In order to reduce the influence of the etch damage, the thickness of the SOT electrode layer may be increased to a thickness, but since a spin diffusion length is short in the SOT electrode layer, this may lead to deterioration in SOT effect and an increase in an operation current.

Platinum (Pt) is a material that is known to have a large spin hall angle ($\theta_{SH}$), where the spin hall angle ($\theta_{SH}$) represents efficiency in a conversion process from a current to a spin current. In the case where a layer including this material is used as the SOT electrode layer, the platinum may be redeposited on a side surface of the MTJ, due to an over-etching during a process of etching the layer. The platinum redeposited on the side surface of the MTJ may serve as a short circuit path of a tunnel barrier, and in this case, the MTJ may have a deteriorated tunnelling magnetoresistance (TMR) property.

In addition, since an MTJ device includes a material (e.g., a magnetic material) that is hardly etched, it is difficult to satisfactorily etch the MTJ using a conventional reactive ion etching (RIE) method. At the present time, a dry etching method, which is called an argon (Ar) ion beam etching (IBE) process and is performed in an oblique rotation manner, is used for the MTJ etching process. In the case where an etch selectivity between an etch stop layer and the MTJ is not sufficiently large, the patterned MTJ may have a skirt shape that creates difficulties in forming a highly-integrated device.

SUMMARY

According to an aspect of the inventive concepts, a magnetoresistive device is provided that includes a spin-orbit-torque (SOT) electrode layer. A first magnetic layer, a first non-magnetic layer, and a second magnetic layer are sequentially stacked over the SOT electrode layer. An interface layer is located between the SOT electrode layer and the first magnetic layer, and an etch stop layer covers a surface portion of the SOT electrode layer and is located adjacent the interface layer. The interface layer comprises a metal having a spin diffusion length that is greater than a thickness of the interface layer, and the etch stop layer comprises an oxide or nitride material of the metal.

A composition percentage of the metal in the interface layer may be equal to or higher than 90 at %, and a composition percentage of the oxide or nitride material of the metal in the etch stop layer may be equal to or higher than 90 at %.

A spin diffusion length of the metal may be at least five times the thickness of the interface layer.

The metal may be one of Ti, Al, Si, Ge, Cu, Mo, V, Nb, Zn, and Ta or a mixture of any two or more of Ti, Al, Si, Ge, Cu, Mo, V, Nb, Zn, and Ta. XXXX The SOT electrode layer may include a material causing a spin hole effect (SHE) in bulk.

The SOT electrode layer may include a magnetic material and produces or accumulates a spin current at an interface between the SOT electrode layer and the interface layer.

The etch stop layer includes a first portion located on the SOT electrode layer and contacting a first side of the interface layer, and a second portion located on the SOT electrode layer and contacting a second side of the interface layer opposite the first side of the interface layer. Also, the first magnetic layer, the first non-magnetic layer, and the second magnetic layer may constitute a magnetic tunnel junction (MTJ), and the first and second sides of the interface layer are vertically aligned with sidewalls of the MTJ.

According to another aspect of the inventive concepts, a magnetic memory is provided which includes a spin-orbit-torque (SOT) electrode layer. A first magnetic layer, a first non-magnetic layer, and a second magnetic layer are sequentially stacked on the SOT electrode layer. An interface layer is located between the SOT electrode layer and the first magnetic layer, and an etch stop layer covers a surface portion of the SOT electrode layer and is located adjacent the interface layer. A first electrode is coupled to a first end of the SOT electrode layer, a second electrode is coupled to a second end of the SOT electrode layer opposite the first end, and a third electrode is coupled to the second magnetic layer. The interface layer comprises a metal having a spin diffusion length that is greater than a thickness of the interface layer, and the etch stop layer comprises an oxide or nitride material of the metal.

According to still another aspect of the inventive concepts, a method of fabricating a magnetoresistive device is provided. The method includes stacking an SOT electrode layer, an interface layer, a first magnetic layer, a first non-magnetic layer, and a second magnetic layer. The method further includes forming a mask pattern on the second magnetic layer, and performing an etching process using the mask pattern as an etch mask to etch the second magnetic layer, the first non-magnetic layer, and the first magnetic layer. The method further includes oxidizing or nitrating a portion of the interface layer to form an etch stop layer, during the etching process. The etching process is performed using an etching gas containing oxygen or nitrogen, and the interface layer comprises a metal having a spin diffusion length that is greater than a thickness of the interface layer.

The etch stop layer may include an oxide or nitride material of the metal, and the oxide or nitride material of the metal may have an etch rate that is lower than an etch rate of a composition included in at least one of the first magnetic layer, the first non-magnetic layer, and the second magnetic layer, during the etching process.

DETAILED DESCRIPTION

Example embodiments of the inventive concepts will now be described more fully with reference to the accompanying drawings, in which example embodiments are shown.

Figure 1:
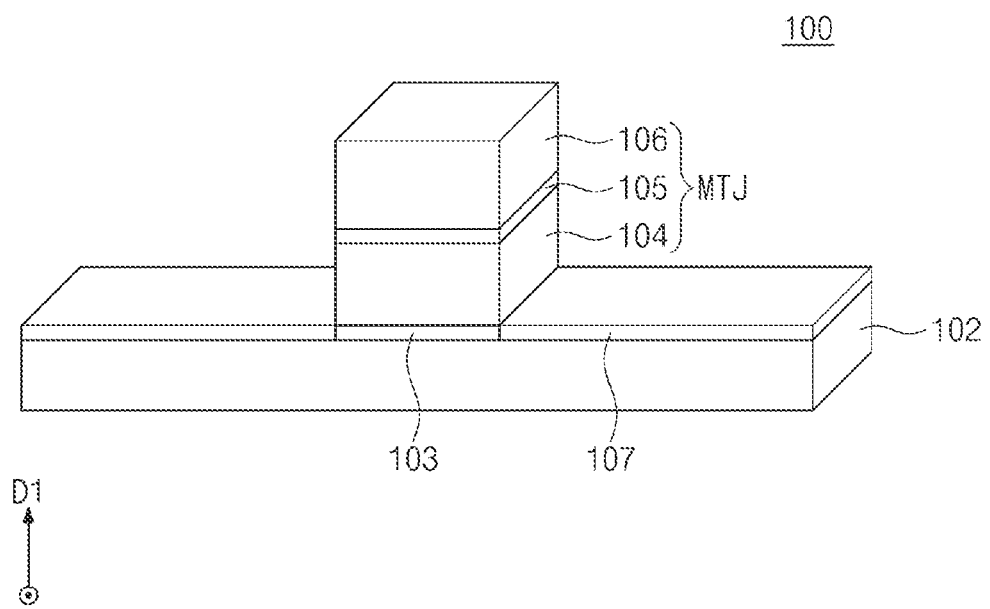
FIG. 1 is a perspective view schematically illustrating a structure of a magnetoresistive device according to some embodiments of the inventive concepts.

FIG. 1 is a perspective view schematically illustrating a structure of a magnetoresistive device according to a first embodiment of the inventive concepts.

Referring to FIG. 1, a magnetoresistive device 100 may include a SOT electrode layer 102, an interface layer 103, a first magnetic layer 104, a first non-magnetic layer 105, a second magnetic layer 106, and an etch stop layer 107. The first magnetic layer 104, the first non-magnetic layer 105, and the second magnetic layer 106 may constitute a magnetic tunnel junction MTJ. As shown in the figure, the etch stop layer 107 may include a first portion located on the SOT electrode layer 102 and contacting a first side of the interface layer 103, and a second portion located on the SOT electrode layer 102 and contacting a second side of the interface layer 103 opposite the first side of the interface layer 103. Also, the first magnetic layer 104, the first non-magnetic layer 105, and the second magnetic layer 106 may constitute a magnetic tunnel junction (MTJ), and the first and second sides of the interface layer 103 may be vertically aligned with sidewalls of the MTJ.

A magnetization direction of the first magnetic layer 104 may be controlled by a current flowing through the SOT electrode layer 102. For example, the magnetization direction of the first magnetic layer 104 may be inverted by the current flowing through the SOT electrode layer 102. The SOT electrode layer 102 may be called 'a channel layer'. The SOT electrode layer 102 may include a material causing a spin hole effect (SHE) in bulk. The SOT electrode layer 102 may include a magnetic material and may include a material causing a spin current or spin accumulation at an interface between the SOT electrode layer 102 and the interface layer 103.

The interface layer 103 may include a metal having a spin diffusion length that is greater than a thickness of the interface layer 103. The thickness of the interface layer 103 may be a dimension of the interface layer 103 measured in a direction (e.g., a first direction D1) perpendicular to the interface between the interface layer 103 and the SOT electrode layer 102. An oxide or nitride material of the metal included in the interface layer 103 may have a slower etch rate or speed than an etch rate of a material (e.g., Co or Fe) which is contained in at least one of the first magnetic layer 104, the first non-magnetic layer 105, and the second magnetic layer 106. For example, the metal included in the interface layer 103 may be one of Ti, Al, Si, Ge, Cu, Mo, V, Nb, Zn, and Ta, or a mixture of any two or more of Ti, Al, Si, Ge, Cu, Mo, V, Nb, Zn, or Ta. A composition percentage of the metal in the interface layer 103 may be higher than 90 at %. As an example, the composition percentage of the metal in the interface layer 103 may be equal to or higher to 90 at % and may be equal to or lower than 100 at %. The interface layer 103 may include an alloy of a metal and other element, and a composition percentage of other element in the interface layer 103 may be smaller than 10 at %. In an embodiment, the composition percentage of other element(s) in the interface layer 103 may be equal to or higher than 0 at % and may be smaller than 10 at %.

Preferably, the interface layer 103 may include a metal having a spin diffusion length which is five times or more the thickness of the interface layer 103. In the case where the spin diffusion length is equal to the thickness of the interface layer 103, a spin signal passing through the interface layer 103 may be decreased by a factor of $e^{-1}=0.37$. In the case where the spin diffusion length is five times the thickness of the interface layer 103, a spin signal passing through the interface layer 103 may be decreased by a factor of $e^{-0.2}=0.82$.

The first magnetic layer 104 may be formed of a magnetic material. The first magnetic layer 104 may serve as a free layer of an SOT-MRAM device, which may also be called 'a storage layer'. That is, the magnetization direction of the first magnetic layer 104 may determine the data (or bit value) stored in the SOT-MRAM device.

The first non-magnetic layer 105 may be formed of a non-magnetic material. The first non-magnetic layer 105 may serve as a tunnel barrier.

The second magnetic layer 106 may be formed of a magnetic material. The second magnetic layer 106 may serve as a reference layer of the SOT-MRAM device, which may also be called 'a fixed layer'. The second magnetic layer 106 may have a fixed magnetization direction. There may be a difference in read current of the magnetoresistive device 100 depending on whether the magnetization directions of the first and second magnetic layers 104 and 106 are the same (i.e., parallel to each other) or different (i.e., antiparallel to each other).

The etch stop layer 107 may include an oxide or nitride material of the metal that is included in the interface layer 103. For example, the etch stop layer 107 may include an oxide or nitride material of one of Ti, Al, Si, Ge, Cu, Mo, V, Nb, Zn, and Ta or a mixture containing an oxide or nitride material of any two or more of Ti, Al, Si, Ge, Cu, Mo, V, Nb, Zn, or Ta. Hereinafter, the oxide or nitride material of the metal may be referred as a metal oxide or metal nitride. In the etch stop layer 107, a composition percentage of the metal oxide or metal nitride may be 90 at %. As an example, in the etch stop layer 107, the composition percentage of the metal oxide or metal nitride may be equal to or higher than 90 at % and may be equal to or lower than 100 at %. The etch stop layer 107 may include a compound which contains the metal oxide or metal nitride and one or more other elements (or an oxide or nitride material of the one or more other elements), and a composition percentage of the one or more other elements (or the oxide or nitride material of the one or more other elements) in the etch stop layer 107 may be lower than 10 at %. As an example, a composition percentage of the one or more other elements (or the oxide or nitride material of the one or more other elements) in the etch stop layer 107 may be equal to higher than 0 at % and may be lower than 10 at %.

Figure 2:
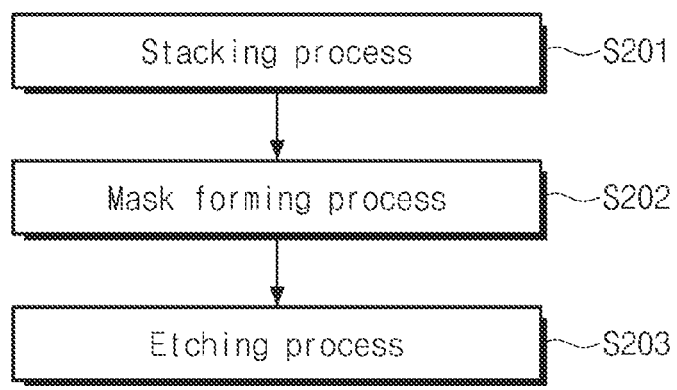
FIG. 2 is a flow chart for reference in describing a method of fabricating a magnetoresistive device, according to some embodiments of the inventive concepts.
Figure 3:
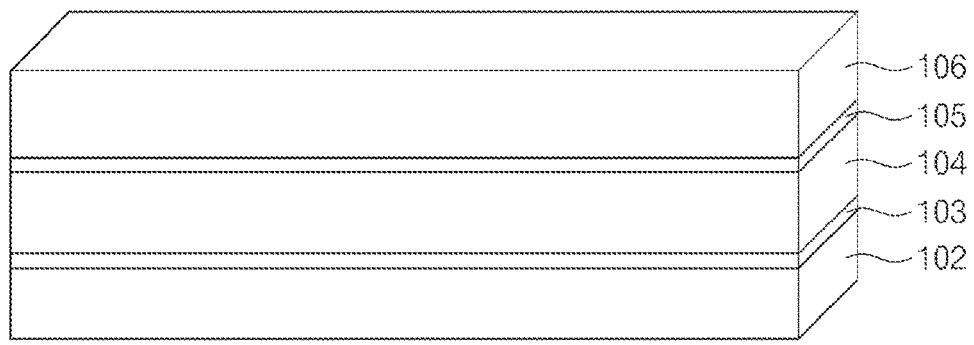
FIG. 3 is a perspective view for reference in describing a step S201 of FIG. 2.
Figure 4:
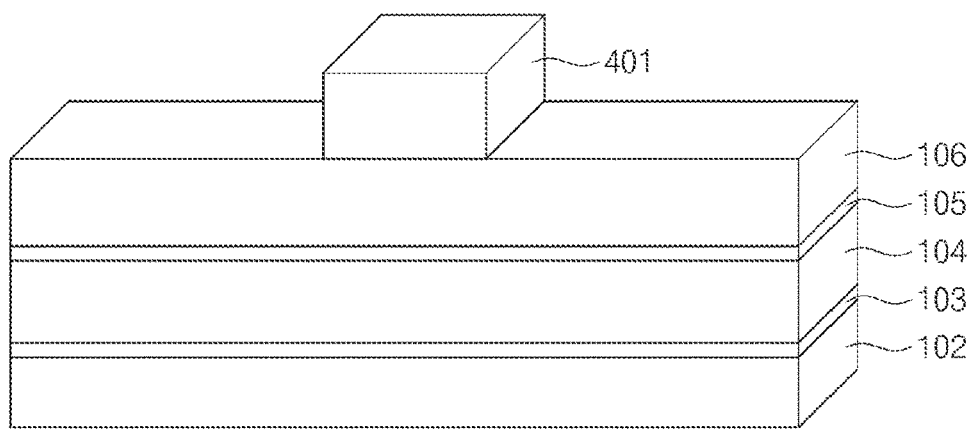
FIG. 4 is a perspective view for reference in describing a step S202 of FIG. 2.
Figure 5:
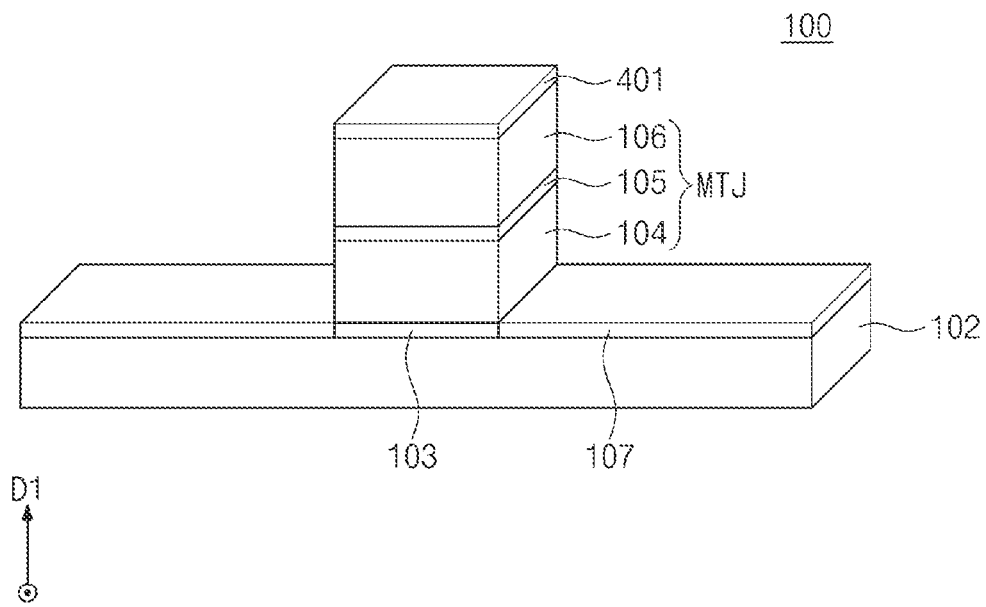
FIG. 5 is a perspective view for reference in describing a step S203 of FIG. 2.

Next, a method of fabricating the magnetoresistive device 100 will be described with reference to FIGS. 2 to 5. FIG. 2 is a flow chart for reference in describing a method of fabricating a magnetoresistive device according to the first embodiment of the inventive concept. FIG. 3 is a perspective view for reference in describing a step S201 of FIG. 2. FIG. 4 is a perspective view illustrating a step S202 of FIG. 2. FIG. 5 is a perspective view for reference in describing a step S203 of FIG. 2.

Referring to FIGS. 2 and 3, the SOT electrode layer 102, the interface layer 103, the first magnetic layer 104, the first non-magnetic layer 105, and the second magnetic layer 106 may be sequentially stacked (in step S201).

Referring to FIGS. 2 and 4, a mask pattern 401, which is configured to mask an underlying MTJ device to be formed in a subsequent step, may be formed on the second magnetic layer 106 (in step S202). As an example, the formation of the mask pattern 401 may include forming a mask layer on the second magnetic layer 106 and patterning the mask layer using a photolithography process or the like.

Referring to FIGS. 2 and 5, the second magnetic layer 106, the first non-magnetic layer 105, and the first magnetic layer 104 may be sequentially etched using the mask pattern 401 as a mask (in step S203). As an example, the second magnetic layer 106, the first non-magnetic layer 105, and the first magnetic layer 104 may be etched by an ion beam etching (IBE) process. Portions of the first magnetic layer 104, the first non-magnetic layer 105, and the second magnetic layer 106, which are exposed by the mask pattern 401 or are not vertically overlapped with the mask pattern 401, may be removed by the etching process. The etching process may be performed using a gas mixture of an argon (Ar) gas and an additional gas (e.g., of oxygen or nitrogen). Accordingly, a portion of the interface layer 103, which is exposed by the mask pattern 401, i.e., is not vertically overlapped with the mask pattern 401, may be oxidized or nitrated during the etching process, and as a result, the etch stop layer 107 may be formed. The etch stop layer 107 may prevent or suppress a portion of the SOT electrode layer 102, which is not vertically overlapped with the mask pattern 401, from being over-etched by the etching process. The etch stop layer 107 may include an oxide or nitride material of the metal that is included in the interface layer 103. For example, the etch stop layer 107 may include a metal oxide or a metal nitride, which includes the same metal as the metal included in the interface layer 103. The metal oxide or the metal nitride of the etch stop layer 107 may exhibit an etch rate which is lower than an etch rate of a composition included in at least one of the first magnetic layer 104, the first non-magnetic layer 105, and the second magnetic layer 106, during the etching process. In some embodiments, although not shown, an additional layer may be stacked on the second magnetic layer 106, for an MTJ structure. In this case, the additional layer on the second magnetic layer 106 may be etched by a first ion beam etching (IBE) process using an etching gas, which contains only argon (Ar) and not oxygen or nitrogen. Thereafter, the second magnetic layer 106, the first non-magnetic layer 105, and the first magnetic layer 104 may be etched by a second ion beam etching (IBE) process using a mixture gas of an argon (Ar) gas and an additional gas (e.g., of oxygen or nitrogen).

The first magnetic layer 104, the first non-magnetic layer 105, and the second magnetic layer 106 may be referred to as an MTJ layer. In some embodiments, the MTJ layer may be etched using a reactive ion etching (RIE) process. In this case, the MTJ layer may be etched by a reactive ion etching (RIE) process, in which an etching gas containing oxygen or nitrogen is used, similar to the ion beam etching (IBE) process. As an example, the second magnetic layer 106 may be etched by a first reactive ion etching (RIE) process using a first etching gas, which does not contain oxygen and nitrogen, and other layers below the second magnetic layer 106 may be etched by a second reactive ion etching (RIE) process using a second etching gas, which contains oxygen and nitrogen. As another example, the entirety of the MTJ layer may be etched by a reactive ion etching (RIE) process using an etching gas, which contains oxygen or nitrogen.

During the afore-described etching process (e.g., the ion beam etching (IBE) or reactive ion etching (RIE) process) to etch the MTJ layer, a portion of the interface layer 103 may be oxidized or nitrated to form the etch stop layer 107. Accordingly, as shown in FIG. 5, the MTJ including the first magnetic layer 104, the first non-magnetic layer 105, and the second magnetic layer 106 may have a side surface that is substantially perpendicular to a top surface of the SOT electrode layer 102. In addition, since the etch stop layer 107 is formed on the surface of the SOT electrode layer 102, it may be possible to prevent or suppress a metal in the SOT electrode layer 102 from being redeposited on a side surface of the MTJ during the etching process.

Figure 6:
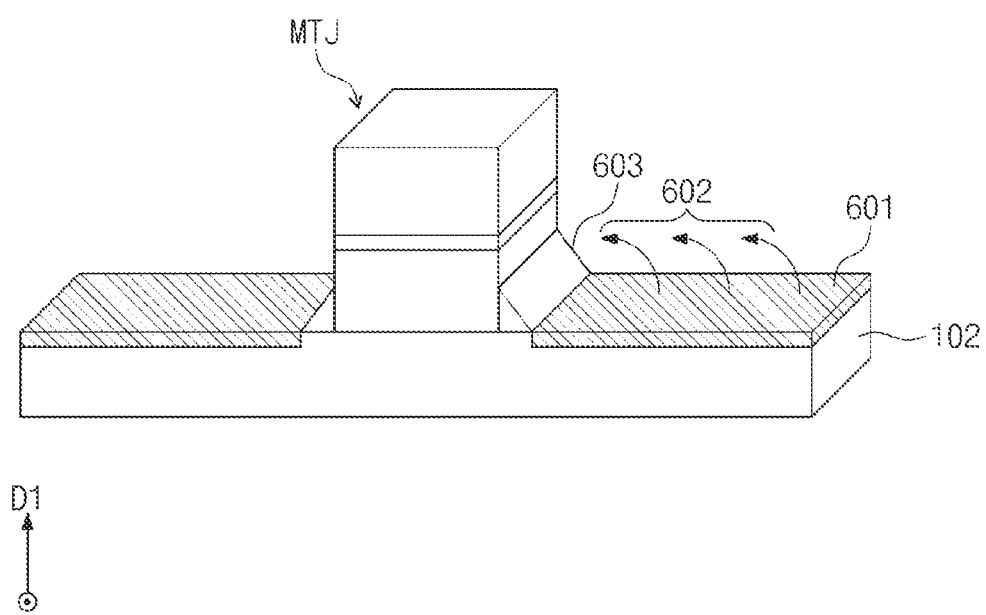
FIG. 6 is a perspective view illustrating a schematic structure of a conventional magnetoresistive device.

In a conventional process of fabricating a magnetoresistive device, the etch stop layer 107 is not provided, and thus, several problems may occur during an MTJ etching process. FIG. 6 is a perspective view schematically illustrating a structure of a conventional magnetoresistive device.

Referring to FIG. 6, ideally, it is necessary to stop an etching process at an interface between the MTJ layer and the SOT electrode layer 102, but to avoid technical issues caused by a non-uniform etching or to obtain an etch stop signal, the etching process is in practice performed in an over-etching manner. In this case, since the etch stop layer 107 is absent, an etch damage layer 601 may be formed on the surface of the SOT electrode layer 102. The etch damage layer 601 may cause a reduction in conductivity of the SOT electrode layer 102 or a spin current diffusion and may deteriorate performance of the SOT-MRAM device. Furthermore, as a result of the over-etching, the metal included in the SOT electrode layer 102 may be redeposited on a side surface of the MTJ (e.g., see 602). The re-deposited metal may lead to a short circuit issue in a tunnel barrier of the MTJ and deterioration in a tunnelling magnetoresistance property of the MTJ. In addition, if the etch stop process is abnormally performed as a result of over-etching, the MTJ may have an undesired shape, after the etching of the MTJ layer. That is, a skirt-shaped portion 603 may be formed near a lower portion of the MTJ, as shown in FIG. 6, and in this case, it is difficult to reduce a size or pitch of the device.

According to an embodiment of the inventive concept, as described above, the etch stop layer 107 may prevent or suppress the SOT electrode layer 102 from being damaged by over-etching, and thus, the SOT electrode layer 102 may have a thickness that is large enough to produce a flow of a write current. Furthermore, it may be possible to suppress a short circuit issue in a tunnel barrier of an MTJ and a skirt shape problem of the MTJ, which are caused by an over-etching and the consequent metal re-deposition.

Referring back to FIGS. 2 and 5, a process of removing the mask pattern 401 may be additionally performed, after the etching process of the MTJ layer (in step S203). In some embodiments, as described above, an additional layer may be stacked on the second magnetic layer 106 (in step S201). Examples, in which an additional layer is stacked on the second magnetic layer 106, will be described in the following embodiments.

A magnetoresistive device according to second embodiment of the inventive concept will be described. The magnetoresistive device may be an SOT-MRAM device with an MTJ.

Referring back to FIG. 1, the SOT electrode layer 102 may include an $Au_{0.25}Pt_{0.75}$ alloy, and the first magnetic layer 104, which is used as a storage layer, may have a perpendicular magnetic anisotropy (PMA). The magnetoresistive device according to the second embodiment may include another layer, which is additionally provided in the magnetoresistive device 100 according to the first embodiment.

In detail, the magnetoresistive device of the second embodiment may include, for example, a Ta (1 nm) layer, an $Au_{0.25}Pt_{0.75}$ (4 nm) layer, a Ti (2 nm) layer, a CoFeB (1 nm) layer, an MgO (1 nm) layer, a CoFeB (1.4 nm) layer, a Ta (0.3 nm) layer, a PMA multiple layer, an Ru (0.9 nm) layer, a PMA multiple layer, a capping layer, and a hard mask layer, which are sequentially deposited on an interlayer insulating layer (e.g., of $SiO_2$) using a sputtering apparatus, where a numerical value in a parenthesis represents a thickness of a relevant layer. Here, the $Au_{0.25}Pt_{0.75}$ (4 nm) layer may be used as the SOT electrode layer 102 and may serve as a highly efficient spin current source, because its spin hole angle ($\theta_{SH}$) has a very large value as given in the following formula.

$$\overline{\theta_{SH} > 0.58} \qquad \text{[Formula 1]}$$

In addition, the Ta (1 nm) layer may be provided to improve a close contact property and a uniformity property of the $Au_{0.25}Pt_{0.75}$ (4 nm) layer, and due to its high resistance, there may be no current flowing therethrough. Accordingly, the Ta (1 nm) layer may have little contribution to production of the spin current.

The Ti (2 nm) layer may serve as the interface layer 103. As will be described below, a portion of the Ti (2 nm) layer, which is located outside of the pillar-shaped MTJ, may be oxidized to serve as the etch stop layer 107, and the remaining portion of the Ti (2 nm) layer, which is located below the MTJ, may not prevent the spin current from being supplied from the SOT electrode layer 102 to the MTJ.

The CoFeB (1 nm) layer and other layers thereon may constitute a magnetic tunnel junction MTJ exhibiting a perpendicular magnetic anisotropy (PMA), and in this case, the CoFeB (1 nm) layer may serve as a storage layer.

Hereinafter, a method of forming the magnetoresistive device will be described below. First, a resist may be used to form a mask pattern, which has the same shape as the MTJ, on the hard mask layer. Next, the hard mask layer may be etched by a dry etching process, such as a reactive ion etching (RIE) process.

A pillar-shaped MTJ may be formed by etching the layers, which are located below the hard mask layer, through a dry etching process, such as an ion beam etching (IBE) process, using the etched hard mask layer. During the etching process to form the MTJ, a first ion beam etching (IBE) process using only Ar gas may be performed, until the Ta (0.3 nm) layer is removed. The CoFeB (1.4) layer and other layers therebelow may be etched by a second ion beam etching (IBE) process using an Ar-based etching gas, in which a tiny amount of $O_2$ is added, and in this case, the second ion beam etching process may be terminated on the Ti (2 nm) layer.

Here, in the case where the second ion beam etching (IBE) process, in which a mixture gas of Ar and $O_2$ is used, is performed on the Ti (2 nm) layer, during the second ion beam etching process, a portion of the Ti (2 nm) layer may be easily transformed to $TiO_X$ and an etch rate of $TiO_X$ may be lowered to about ⅕ that of Co or Fe. In other words, the $TiO_X$ formed during the second ion beam etching process may become the etch stop layer 107. Accordingly, it may be possible to suppress a damage issue of the SOT electrode layer 102, which may occur in a conventional MTJ etching process.

Meanwhile, since the Ti (2 nm) layer below the MTJ is not exposed to ions, which are produced from the etching gas (e.g., a mixture gas of Ar and $O_2$) for the second ion beam etching process, it may include an unoxidized portion of Ti. Here, a spin diffusion length of Ti may be sufficiently long (e.g., about 13 nm), and due to the presence of the remaining Ti portion, a spin transmittance property may be improved. Thus, a spin current produced in the SOT electrode layer 102 may be effectively injected into the CoFeB storage layer 104.

In addition, the etch stop layer 107 may be a $TiO_X$ layer, which is formed as a result of the oxidation during the MTJ etching process, and thus, due to an insulating property of the $TiO_X$ layer, the etch stop layer 107 may not form a short circuit path in the MTJ, even when the $TiO_X$ layer is re-deposited on the side surface of the MTJ during the MTJ etching process. Thus, it may be possible to suppress a MTJ sidewall re-deposition problem, which is one of problems caused by the MTJ etching process, and the consequent deterioration of TMR characteristics.

Furthermore, the etch stop layer 107, which includes the $TiO_X$ layer formed as a result of the oxidation during the MTJ etching process, may have an etch selectivity of about ⅕, compared with the MTJ; that is, during the MTJ etching process, an etch rate of the etch stop layer 107 is about ⅕ times an etch rate of the MTJ layer. Thus, the etch stop layer 107 may not be fully removed even when the MTJ etching process is performed in an over-etching manner. In this case, the skirt shape problem of the MTJ, which is one of the problems caused by the MTJ etching process, may be prevented by the etching process that is performed in the over-etching manner. As a result, it may be possible to form a magnetoresistive device in a desired shape, and thus, an operation of the device may be performed in a uniform and stable manner.

In the magnetoresistive device according to the second embodiment, the interface layer 103 (e.g., made of Ti) may have a sufficiently long spin diffusion length and may have an increased etch resistant property in a dry etching process, which is performed on the MTJ layer. By using the interface layer 103 (e.g., made of Ti), it may be possible to prevent a damage issue of the SOT electrode layer 102, which may be caused by the MTJ etching process, the deterioration in TMR property of the MTJ and the skirt shape problem of the MTJ, which are caused by the re-deposition of the SOT electrode layer 102. In addition, it may be possible to increase productivity in a process of fabricating an SOT-MRAM device having a fine device structure.

An SOT-MRAM device, in which the SOT electrode layer 102 is formed of CoFeB and is realized using an MTJ with a PMA storage layer, will be described next as a third embodiment of the inventive concepts.

Referring back to FIG. 1, the magnetoresistive device of the third embodiment may have a stacking structure, in which a Ta (1 nm) layer, a CoFeB (4 nm) layer, a Ti (3 nm) layer, a CoFeB (1 nm) layer, an MgO (1 nm) layer, a CoFeB (1.4 nm) layer, a Ta (0.3 nm) layer, a PMA multiple layer, a Ru (0.9 nm) layer, a PMA multiple layer, a capping layer, and a hard mask layer are sequentially deposited on an interlayer insulating layer (e.g., of $SiO_2$) using a sputtering apparatus, where a numerical value in a parenthesis represents a thickness of a relevant layer. Here, the CoFeB (4 nm) layer may serve as the SOT electrode layer 102.

The Ti (3 nm) layer may serve as the interface layer 103. As will be described below, a portion of the Ti (3 nm) layer, which is located outside of the pillar-shaped MTJ, may be oxidized to serve as the etch stop layer 107, and the remaining portion of the Ti (3 nm) layer, which is located below the MTJ, may not prevent the spin current from being supplied from the SOT electrode layer 102 to the MTJ.

The CoFeB (1 nm) layer and the layers thereon may constitute the magnetic tunnel junction MTJ exhibiting a perpendicular magnetic anisotropy (PMA), and in this case, the CoFeB (1 nm) layer may serve as a storage layer. Here, a spin current, which is produced by a bulk spin hall effect (SHE), may be absent in the CoFeB (4 nm) layer serving as the SOT electrode layer 102, and at an interface between the CoFeB (4 nm) layer and the Ti (3 nm) layer, a current may be converted to a spin current.

A current, which is applied to the SOT electrode layer 102, may flow along the interface between the CoFeB (4 nm) layer and the Ti (3 nm) layer, but due to a difference in conductivity between two different materials and the consequent asymmetry of carriers, there may be a spin current flowing into the MTJ through the interface. Here, in the case where the layer made of a ferromagnetic material (e.g., CoFeB) has an in-plane magnetization that is parallel to a direction of the current, a portion of a spin current having a perpendicular spin polarization may be injected into the storage layer (i.e., the CoFeB (1 nm) layer) of the MTJ.

Here, a spin current, which is produced by a typical spin hole effect (SHE), has only an in-plane spin polarization. Thus, to invert magnetization of a storage layer having a perpendicular magnetic anisotropy (PMA), it was necessary to apply an external magnetic field of an in-plane direction. However, since a spin current, which is produced by a mechanism according to the proposed inventive concept, has a perpendicular spin polarization, it may be unnecessary to apply an external magnetic field. Accordingly, the switching operation of the SOT-MRAM device may be more easily performed.

A method of forming the device structure according to the third embodiment may be substantially the same as that described in connection with the second embodiment. First, the hard mask layer may be patterned using a resist mask. Next, a dry etching process, such as an ion beam etching (IBE) process, may be performed to pattern the MTJ in a pillar shape. During the MTJ etching process, the CoFeB (1.4 nm) layer and other layers therebelow may be etched by an ion beam etching (IBE) process using an Ar-based etching gas, in which a tiny amount of $O_2$ is added, and in this case, the ion beam etching process may be terminated on the Ti (3 nm) layer.

Here, in the case where the ion beam etching process using a mixture gas of Ar and $O_2$ is performed on the Ti (3 nm) layer, a portion of the Ti (3 nm) layer may be changed to $TiO_X$ during the etching process, and the $TiO_X$ formed during the etching process may become the etch stop layer 107. Accordingly, it may be possible to suppress a damage issue of the SOT electrode layer 102, which may occur in a conventional MTJ etching process. Meanwhile, since the Ti (3 nm) layer below the MTJ is not exposed to ions, which are produced from a mixture gas of Ar and $O_2$ during the etching process, it may include an unoxidized portion of Ti. Here, a spin diffusion length of Ti may be sufficiently long (e.g., about 13 nm), and due to the presence of the remaining Ti portion, a spin transmittance property may be improved. Thus, a spin current produced in the SOT electrode layer 102 may be effectively injected into the CoFeB storage layer 104.

The MTJ sidewall re-deposition problem or the skirt shape problem of the MTJ, which may occur during the MTJ etching process, may be solved by using the Ti interface layer 103 and by an ion beam etching process, in which a mixture gas of Ar and $O_2$ is used, as described with reference to the second embodiment.

Figure 7:
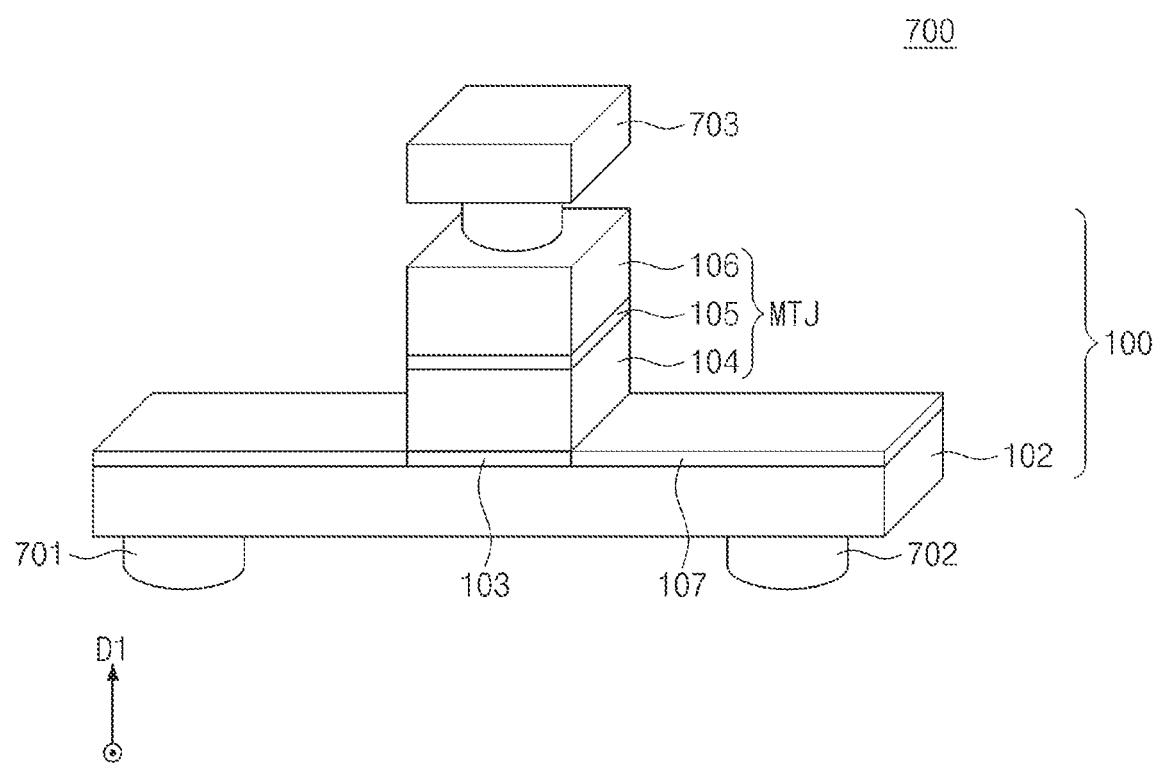
FIG. 7 is a perspective view schematically illustrating a structure of a magnetic memory according to some embodiments of the inventive concepts.

A fourth embodiment will now be described which relates to a magnetic memory device, to which the magnetoresistive device of the first embodiment is applied. FIG. 7 is a perspective view schematically illustrating a structure of a magnetic memory according to the fourth embodiment of the inventive concept. FIG. 7 illustrates an example in which the magnetoresistive device of the first embodiment is applied to a SOT-MARAM that is a 3-terminal device.

Referring to FIG. 7, a magnetic memory 700 may include the magnetoresistive device 100, a first electrode 701, a second electrode 702, and a third electrode 703.

The first electrode 701 may be an electrode that is coupled to the SOT electrode layer 102. For example, the first electrode 701 may be disposed near an end of the SOT electrode layer 102.

The second electrode 702 may be an electrode that is coupled to the SOT electrode layer 102. For example, the second electrode 702 may be disposed near an opposite end of the SOT electrode layer 102. The first and second electrodes 701 and 702 may be used to provide a write current to the SOT electrode layer 102. A direction of the write current flowing through the SOT electrode layer 102 may be controlled by the first and second electrodes 701 and 702. Accordingly, it may be possible to control a magnetization direction of the first magnetic layer 104 and to perform a writing operation on the MTJ.

The third electrode 703 may be an electrode that is coupled to the second magnetic layer 106. By measuring a current flowing from at least one of the first and second electrodes 701 and 702 to the third electrode 703 or vice versa, it may be possible to measure resistance of the MTJ and thereby to determine a magnetization direction of the first magnetic layer 104. The magnetization direction of the first magnetic layer 104 may correspond to information stored in the MTJ. In addition, the hard mask or other layers, which have been described with reference to the second and third embodiments, may be further provided between the third electrode 703 and the second magnetic layer 106.

In the magnetic memory 700 according to the fourth embodiment, the SOT electrode layer 102 may have a thickness that does not cause difficulty in producing a flow of a write current, and moreover, it may be possible to suppress a short circuit in a tunnel barrier of the MTJ and a skirt shape problem of the MTJ, which are caused by over-etching of the SOT electrode layer 102 and the consequent metal re-deposition as described previously in connection with FIG. 6.

While example embodiments of the inventive concept have been particularly shown and described, it will be understood by one of ordinary skill in the art that variations in form and detail may be made therein without departing from the spirit and scope of the attached claims. For example, the magnetic memory according to the fourth embodiment may include the magnetoresistive device described with reference to the second and third embodiments.

What is claimed is:

1. A magnetoresistive device, comprising:
   a spin-orbit-torque (SOT) electrode layer;
   a first magnetic layer, a first non-magnetic layer, and a second magnetic layer sequentially stacked over the SOT electrode layer;
   an interface layer located between the SOT electrode layer and the first magnetic layer; and
   an etch stop layer covering a surface portion of the SOT electrode layer and located adjacent the interface layer,
   wherein the interface layer comprises a metal having a spin diffusion length that is greater than a thickness of the interface layer, and
   the etch stop layer comprises an oxide or nitride material of the metal.

2. The magnetoresistive device of claim 1, wherein a composition percentage of the metal in the interface layer is equal to or higher than 90 at %, and
   a composition percentage of the oxide or nitride material of the metal in the etch stop layer is equal to or higher than 90 at %.

3. The magnetoresistive device of claim 2, wherein the spin diffusion length of the metal is at least five times the thickness of the interface layer.

4. The magnetoresistive device of claim 3, wherein the metal is one of Ti, Al, Si, Ge, Cu, Mo, V, Nb, Zn, and Ta or a mixture of any two or more of Ti, Al, Si, Ge, Cu, Mo, V, Nb, Zn, and Ta.

5. The magnetoresistive device of claim 4, wherein the SOT electrode layer comprises a material causing a spin hole effect (SHE) in bulk.

6. The magnetoresistive device of claim 4, wherein the SOT electrode layer comprises a magnetic material and produces or accumulates a spin current at an interface between the SOT electrode layer and the interface layer.

7. The magnetoresistive device of claim 3, wherein the SOT electrode layer comprises a material causing a spin hole effect (SHE) in bulk.

8. The magnetoresistive device of claim 3, wherein the SOT electrode layer comprises a magnetic material and produces or accumulates a spin current at an interface between the SOT electrode layer and the interface layer.

9. The magnetoresistive device of claim 2, wherein the metal is one of Ti, Al, Si, Ge, Cu, Mo, V, Nb, Zn, and Ta or a mixture of any two or more of Ti, Al, Si, Ge, Cu, Mo, V, Nb, Zn, or Ta.

10. The magnetoresistive device of claim 2, wherein the SOT electrode layer comprises a material causing a spin hole effect in bulk.

11. The magnetoresistive device of claim 2, wherein the SOT electrode layer comprises a magnetic material and produces or accumulates a spin current at an interface between the SOT electrode layer and the interface layer.

12. The magnetoresistive device of claim 1, wherein the spin diffusion length of the metal is equal to or larger than five times the thickness of the interface layer.

13. The magnetoresistive device of claim 1, wherein the metal comprises one of Ti, Al, Si, Ge, Cu, Mo, V, Nb, Zn, and Ta or a mixture of any two or more of Ti, Al, Si, Ge, Cu, Mo, V, Nb, Zn, or Ta.

14. The magnetoresistive device of claim 1, wherein the SOT electrode layer comprises a material causing a spin hole effect in bulk.

15. The magnetoresistive device of claim 1, wherein the SOT electrode layer comprises a magnetic material and produces or accumulates a spin current at an interface between the SOT electrode layer and the interface layer.

16. The magnetoresistive device of claim 1, wherein the etch stop layer includes a first portion located on the SOT electrode layer and contacting a first side of the interface layer, and a second portion located on the SOT electrode layer and contacting a second side of the interface layer opposite the first side of the interface layer.

17. The magnetoresistive device of claim 16, wherein the first magnetic layer, the first non-magnetic layer, and the second magnetic layer constitute a magnetic tunnel junction (MTJ), and
   the first and second sides of the interface layer are vertically aligned with sidewalls of the MTJ.

18. A magnetic memory, comprising:
   a spin-orbit-torque (SOT) electrode layer;
   a first magnetic layer, a first non-magnetic layer, and a second magnetic layer sequentially stacked on the SOT electrode layer;
   an interface layer located between the SOT electrode layer and the first magnetic layer;
   an etch stop layer covering a surface portion of the SOT electrode layer and located adjacent the interface layer;
   a first electrode coupled to a first end of the SOT electrode layer;
   a second electrode coupled to a second end of the SOT electrode layer opposite the first end; and
   a third electrode coupled to the second magnetic layer,
   wherein the interface layer comprises a metal having a spin diffusion length that is larger than a thickness of the interface layer, and
   the etch stop layer comprises an oxide or nitride material of the metal.

19. A method of fabricating a magnetoresistive device, comprising:
   sequentially stacking an SOT electrode layer, an interface layer, a first magnetic layer, a first non-magnetic layer, and a second magnetic layer;
   forming a mask pattern on the second magnetic layer;
   performing an etching process using the mask pattern as an etch mask to etch the second magnetic layer, the first non-magnetic layer, and the first magnetic layer; and oxidizing or nitrating a portion of the interface layer to form an etch stop layer, during the etching process, wherein the etching process is performed using an etching gas containing oxygen or nitrogen, and the interface layer comprises a metal having a spin diffusion length that is greater than a thickness of the interface layer.

20. The method of claim 19, wherein the etch stop layer comprises an oxide or nitride material of the metal, and the oxide or nitride material of the metal has an etch rate that is lower than an etch rate of a composition included in at least one of the first magnetic layer, the first non-magnetic layer, and the second magnetic layer, during the etching process.

* * * * *